United States Patent
Chen

(10) Patent No.: US 11,564,338 B2
(45) Date of Patent: Jan. 24, 2023

(54) SUPPORT ASSEMBLY AND DISPLAY DEVICE

(71) Applicant: BEIJING XIAOMI MOBILE SOFTWARE CO., LTD., Beijing (CN)

(72) Inventor: Dongming Chen, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 35 days.

(21) Appl. No.: 17/392,560

(22) Filed: Aug. 3, 2021

(65) Prior Publication Data

US 2022/0061194 A1 Feb. 24, 2022

(30) Foreign Application Priority Data

Aug. 19, 2020 (CN) .......................... 202010839460.9

(51) Int. Cl.
*H05K 7/20* (2006.01)
*H05K 5/00* (2006.01)

(52) U.S. Cl.
CPC ....... *H05K 7/20963* (2013.01); *H05K 5/0017* (2013.01)

(58) Field of Classification Search
CPC ............. H05K 7/20963; H05K 5/0017; H05K 7/2039; H05K 5/0204; H05K 7/20409; H05K 7/20436; F16M 2200/08; F16M 11/041; G06F 1/1601; G06F 1/1632; H04N 5/645; H04N 5/655
See application file for complete search history.

(56) References Cited

U.S. PATENT DOCUMENTS

| 5,440,450 A * | 8/1995 | Lau ........................... G06F 1/20 361/695 |
| 6,122,166 A * | 9/2000 | Mochizuki ............. G06F 1/203 361/679.52 |
| 6,549,414 B1 | 4/2003 | Tokuhara et al. |
| 6,771,498 B2 * | 8/2004 | Wang ..................... G06F 1/203 361/679.52 |
| 7,019,967 B2 * | 3/2006 | DiFonzo ............... G06F 1/1662 174/544 |
| 7,277,282 B2 * | 10/2007 | Tate ..................... H01L 23/427 257/713 |
| 9,268,377 B2 * | 2/2016 | MacDonald ........... G06F 1/203 |
| 9,961,788 B2 * | 5/2018 | Sullivan ................. G06F 1/16 |
| 10,895,389 B2 * | 1/2021 | Abe ..................... F25B 31/006 |
| 2004/0130869 A1 | 7/2004 | Fleck et al. |

(Continued)

FOREIGN PATENT DOCUMENTS

CN 210130022 U 3/2020
EP 2713236 A2 4/2014

(Continued)

OTHER PUBLICATIONS

Indian Patent Application No. 202144017886 Office Action dated Mar. 1, 2022, 5 pages.

(Continued)

*Primary Examiner* — Abhishek M Rathod
(74) *Attorney, Agent, or Firm* — Lathrop GPM LLP

(57) ABSTRACT

A support assembly configured to support a display component, includes: a housing comprising a mounting cavity; a circuit board assembly assembled in the mounting cavity; and a heat dissipation assembly assembled to the circuit board assembly.

16 Claims, 3 Drawing Sheets

(56) References Cited

U.S. PATENT DOCUMENTS

| | | | |
|---|---|---|---|
| 2010/0319883 A1 | 12/2010 | Facusse | |
| 2015/0035420 A1* | 2/2015 | Nicol | ............... H05K 9/0041 |
| | | | 312/236 |
| 2016/0291650 A1* | 10/2016 | Lee | ............... G06F 1/1626 |
| 2019/0235586 A1 | 8/2019 | Tani et al. | |

FOREIGN PATENT DOCUMENTS

| | | |
|---|---|---|
| JP | H1098287 A | 4/1998 |
| JP | 2000357027 A | 12/2000 |
| JP | 2001313485 A | 11/2001 |
| JP | 2006084977 A | 3/2006 |
| JP | 2008292697 A | 12/2008 |
| JP | 2009290637 A | 12/2009 |
| JP | 2011145320 A | 7/2011 |
| KR | 20170123822 A | 11/2017 |

OTHER PUBLICATIONS

Japanese Patent Application No. 2021-076446 Office Action dated Mar. 15, 2022, 9 pages.
Japanese Patent Application No. 2021-076446 English translation of Office Action dated Mar. 15, 2022, 9 pages.
European Patent Application No. 21169901.2 Search Report and Opinion, dated Oct. 14, 2021, 14 pages.

* cited by examiner

SUPPORT ASSEMBLY AND DISPLAY DEVICE

CROSS-REFERENCE TO RELATED APPLICATIONS

This application claims the benefit of and priority to Chinese Patent Application Serial No. 202010839460.9, filed on Aug. 19, 2020, the entire contents of which are incorporated herein by reference for all purposes.

TECHNICAL FIELD

The present disclosure relates to the technical field of display devices, and more particularly, to a support assembly and a display device.

BACKGROUND

Generally, a display device includes a circuit board assembly, and the circuit board assembly is used to supply power to the display device and control the operation of the display device. However, during the operation of the display device, the circuit board assembly tends to heat up, and higher temperature will limit the efficient and stable operation of some components, thereby affecting the normal operation of the display device. For this reason, it is necessary to dissipate heat from the circuit board assembly to ensure the normal operation of the display device.

SUMMARY

The present disclosure provides a support assembly and display device.

Embodiments of an aspect of the present disclosure provide a support assembly configured to support a display component. The support assembly comprises: a housing including a mounting cavity; a circuit board assembly assembled in the mounting cavity; and a heat dissipation assembly assembled to the circuit board assembly.

Embodiments of another aspect of the present disclosure provide a display device. The display device comprises a support assembly; and a display component comprising a display screen. The support assembly is configured to support the display component, and comprises: a housing comprising a mounting cavity; a circuit board assembly assembled in the mounting cavity; and a heat dissipation assembly assembled to the circuit board assembly.

DETAILED DESCRIPTION

Detailed description of the embodiments will be made herein, with examples thereof to be shown in drawings. In the following descriptions, when the drawings are referred to, unless expressed otherwise, the same number in different drawings refers to the same or similar elements. The embodiments described in the embodiments as below do not represent all embodiments that are consistent with the present disclosure. On the contrary, they are only examples of the devices and the methods that are consistent with some of the aspects of the present disclosure as recited in the claims.

Terms used herein in the description of the present disclosure are only for the purpose of describing specific embodiments, but should not be construed to limit the present disclosure. Unless otherwise defined, technical terms or scientific terms used herein shall be understood in the ordinary sense as understood by those of ordinary skill in the art to which the present application belongs. The words "a," "an" and the like used in the specification and the claims of the present application are not intended to limit the quantity but indicate the presence of at least one element or device referred to by the words. Unless otherwise indicated, the terms "comprising" or "containing" mean that the elements or articles before the terms "comprising" or "containing" includes the elements or articles listed after the terms "comprising" or "containing" and do not exclude other elements or articles. The terms "connected" or "coupled" and the like are not limited to physical or mechanical connection, but may include electrical connection, regardless of direct connection or indirect connection.

As used in the description of the present disclosure and the appended claims, the terms "a" and "the" in singular forms are intended to include plural forms, unless clearly indicated in the context otherwise. It should also be understood that, as used herein, the term "and/or" represents and contains any one and all possible combinations of COF encapsulation of one or more associated listed items.

Figure 1:
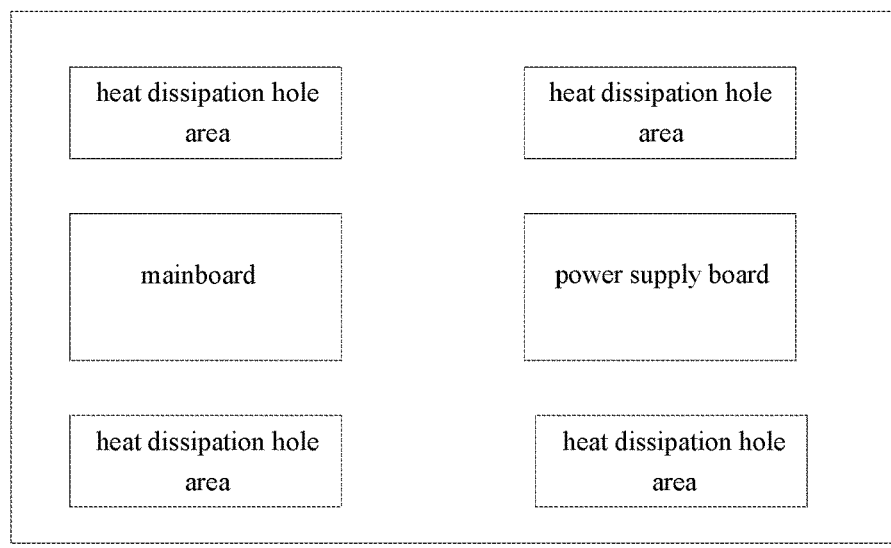
FIG. 1 shows a block diagram of a backplane module of a television according to an embodiment of the related art.

FIG. 1 shows a block diagram of a backplane module of a television (TV) according to an embodiment of the related art. Referring to FIG. 1, the TV includes a display screen (not shown) and a backplane module arranged on the back of the display screen. The backplane module includes a circuit board assembly. The circuit board assembly includes a mainboard and a power supply board that are staggered from each other. Upper and lower areas of the mainboard are heat dissipation hole areas having heat dissipation holes to dissipate heat from the mainboard. Upper and lower areas of the power supply board are heat dissipation hole areas to dissipate heat from the power supply board, and there may be more than one heat dissipation holes in each heat dissipation hole area. If the display screen is made into a transparent display screen, it is necessary to separate the mainboard, the power supply board and other circuit board assemblies from the display screen to ensure a display effect of the transparent display screen. If the mainboard and the power supply board are both arranged in a housing below the display screen, since the mainboard and the power supply board are both assembled in a mounting cavity of the housing, it is necessary to reconsider how to dissipate heat from the circuit board assemblies. Based on this, embodiments of the present disclosure provide a support assembly and a display device, which are described below with reference to the accompanying drawings.

Figure 2:
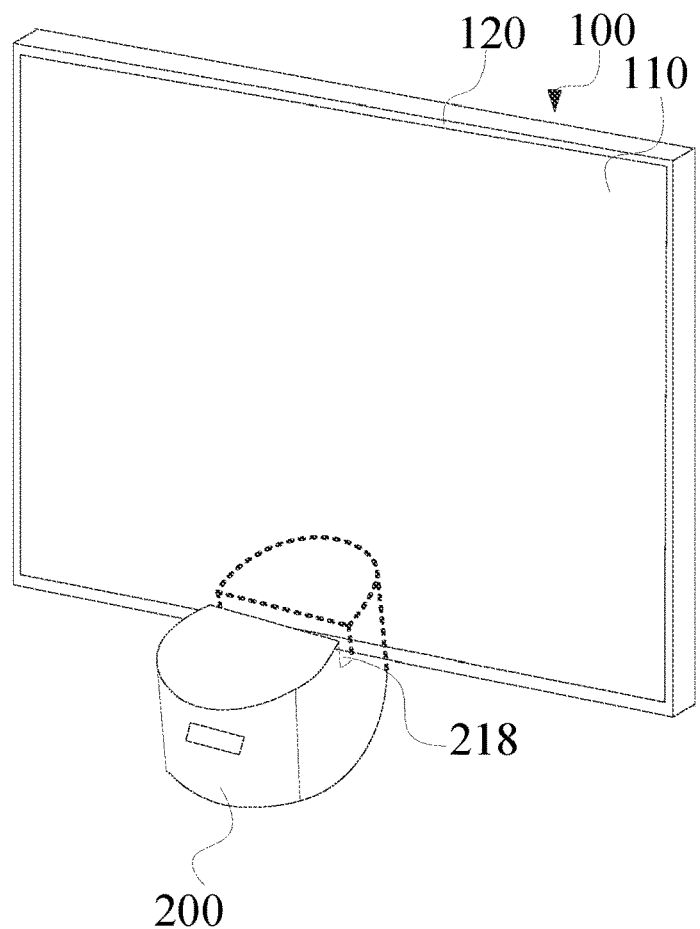
FIG. 2 is a structural diagram of a display device according to an embodiment of the present disclosure.
Figure 3:
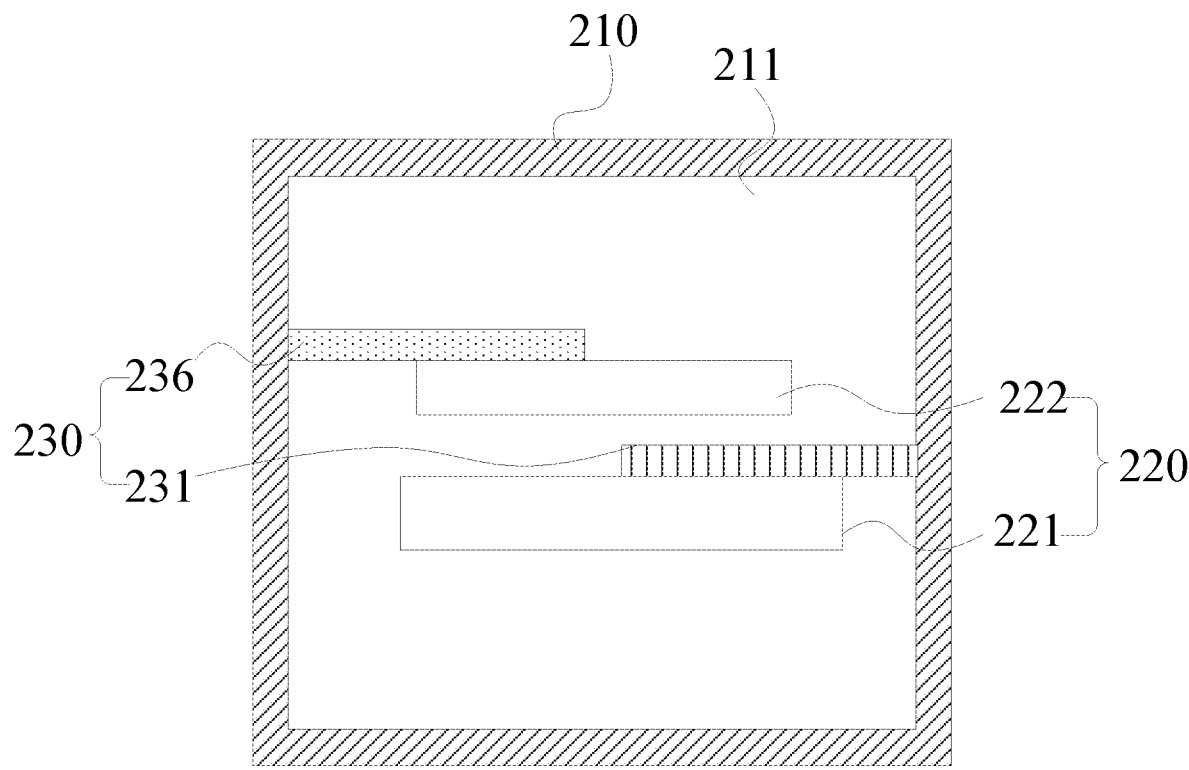
FIG. 3 is a partial structural diagram of a support assembly according to an embodiment of the present disclosure.

FIG. 2 is a structural diagram of a display device according to an embodiment of the present disclosure, and FIG. 3 is a partial structural diagram of a support assembly according to an embodiment of the present disclosure. With reference to FIG. 2 and FIG. 3 in combination, a display device according to some embodiments of the present disclosure includes a display component 100 and a support assembly 200.

The display component 100 includes a display screen 110. In some embodiments, the display screen 110 may be an OLED (organic light-emitting diode) display screen or an LCD (liquid crystal display) display screen. In some embodiments, the display screen 110 may be a transparent display screen, which can display a complete image. When no complete image or no image is displayed, the transparent display screen may be in a transparent state. In some embodiments, the display component 100 may further include a frame 120 arranged at an edge of the display screen 110, and the frame 120 protects the display screen 110. In some embodiments, the display component 100 may further include a glass cover plate (not shown), which is attached to the display screen 110 to improve mechanical strength of the display component 100. The display component 100 is assembled to the support assembly 200.

The support assembly 200 is applied to the display device, and the support assembly 200 includes a housing 210, a circuit board assembly 220, and a heat dissipation assembly 230.

The housing 210 supports the display component 100. The housing 210 can support the bottom, top or sides of the display component 100. In some embodiments, the housing 210 supports the bottom of the display component 100, so that the support assembly 200 is equivalent to a base, which facilitates the placement of the display device. The housing 210 includes a mounting cavity 211 for assembling components such as the circuit board assembly 220. In some embodiments, the housing 210 may be a high-temperature resistant metal housing to facilitate heat conduction and heat dissipation.

The circuit board assembly 220 is assembled in the mounting cavity 211. In some embodiments, the circuit board assembly 220 is electrically coupled to the display component 100 to supply power to the display component 100 or control operation of the display component 100. In addition, the circuit board assembly 220 is assembled in the mounting cavity 211 of the housing 210 and separated from the display component 100, so it is beneficial to realizing the transparent display screen.

The heat dissipation assembly 230 is assembled to the circuit board assembly 220 to dissipate heat from the circuit board assembly 220.

Based on the above, for the support assembly 200 and the display device according to the embodiments of the present disclosure, since the heat dissipation assembly 230 is assembled to the circuit board assembly 220, the heat from the circuit board assembly 220 can be efficiently dissipated, which can ensure efficient and stable operation of the circuit board assembly 220 and hence efficient and stable operation of the display device. Moreover, for the display device according to the embodiments of the present disclosure, since the circuit board assembly 220 and the heat dissipation assembly 230 are assembled in the mounting cavity 211 of the housing 210 of the support assembly 200, separated arrangement of the circuit board assembly 220, the heat dissipation assembly 230, and the display component 100 can be realized, which helps to achieve a transparent display effect of the display screen 110.

In some embodiments, the heat dissipation assembly 230 is coupled to the housing 210, and the heat of the circuit board assembly 220 transfers to the housing 210 through the heat dissipation assembly 230. In this way, since the heat of the circuit board assembly 220 transfers to the housing 210 through the heat dissipation assembly 230, that is, the heat transfers from a high-temperature area to a low-temperature area, the housing 210 is cleverly used to assist heat dissipation to effectively dissipate the heat from the circuit board assembly 220 and ensure the efficient and stable operation of the circuit board component 220 and thus the efficient and stable operation of the display device.

In some embodiments, continuing to refer to FIG. 3, the circuit board assembly 220 includes a mainboard 221, the heat dissipation assembly 230 includes a mainboard heat dissipation member 231, the mainboard heat dissipation member 231 is assembled on the mainboard 221, and one end of the mainboard heat dissipation member 231 is coupled to the housing 210. The mainboard 221 is used to control the operation of the display device. The mainboard 221 has many components thereon and is easy to generate heat. The heat of the mainboard 221 transfers to the housing 210 through the mainboard heat dissipation member 231, which can dissipate heat of the mainboard 221 and facilitate the efficient and stable operation of the mainboard 221. In some embodiments, the mainboard heat dissipation member 231 can be assembled to the mainboard 221 by fixing members like screws. In some embodiments, the mainboard heat dissipation member 231 can be bonded to the mainboard 221 by a thermally conductive adhesive layer, which is not specifically limited in the present disclosure.

Figure 4:
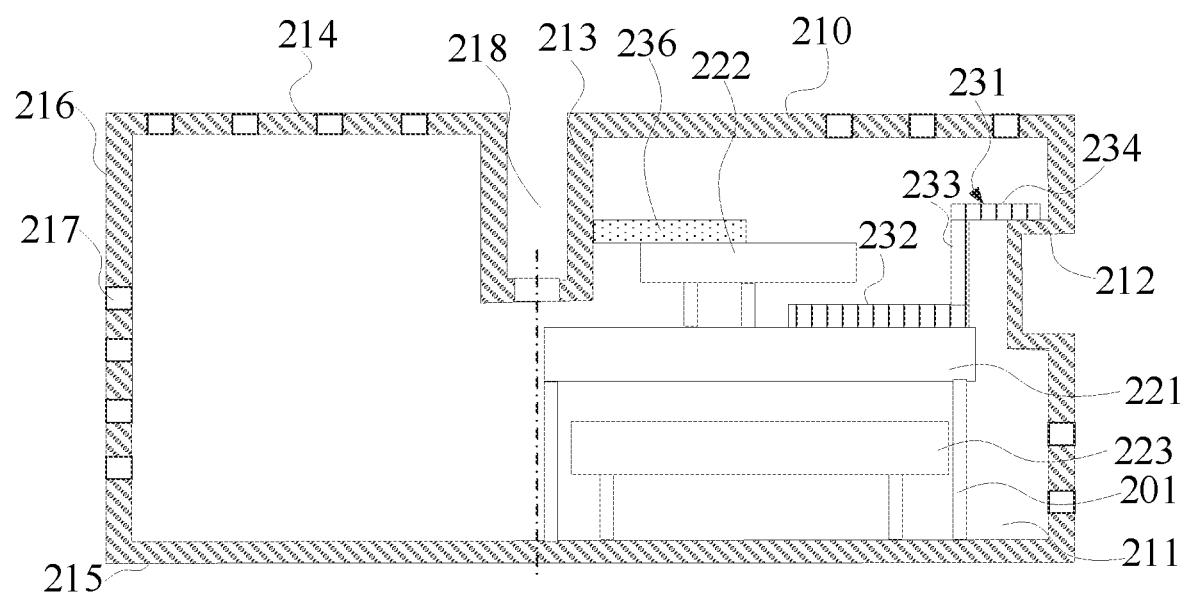
FIG. 4 is a partial structural diagram of a support assembly according to an embodiment of the present disclosure.
Figure 5:
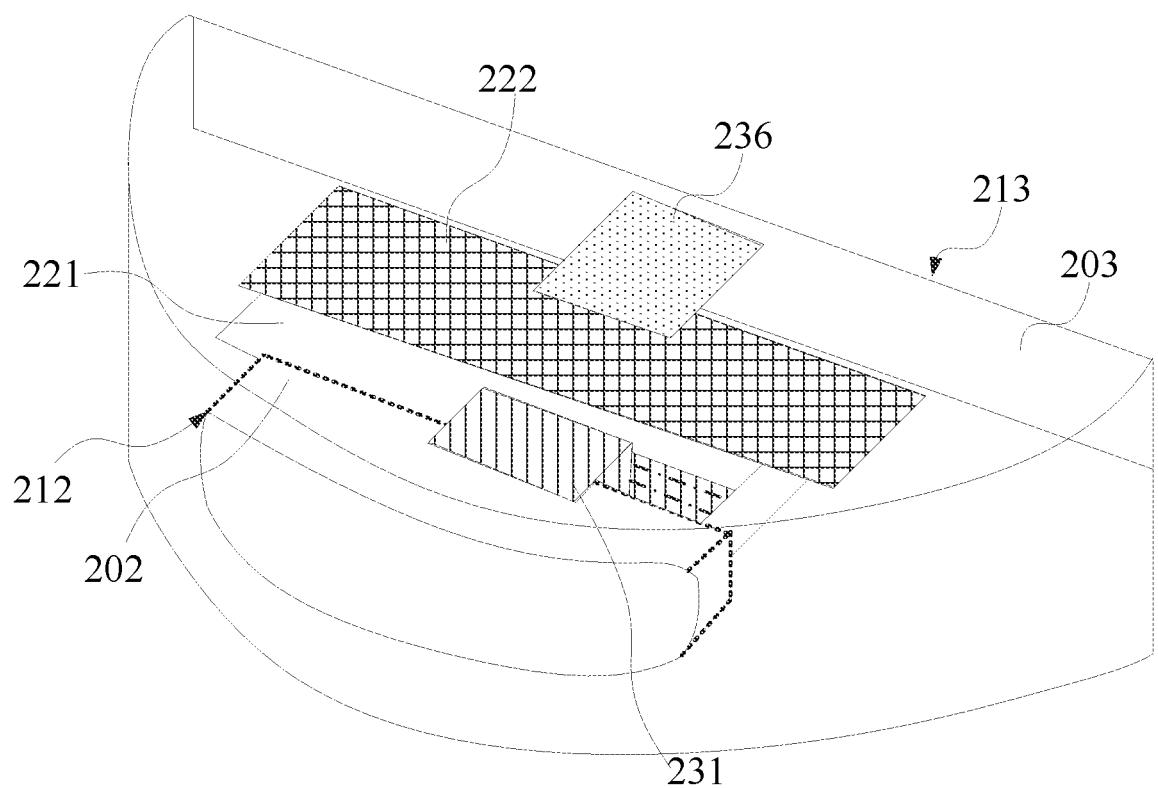
FIG. 5 is a partial structural diagram of a support assembly according to an embodiment of the present disclosure.

FIG. 4 is a partial structural diagram of the support assembly 200 according to an embodiment of the present disclosure, and FIG. 5 is a partial structural diagram of the support assembly 200 according to an embodiment of the present disclosure. In some embodiments, referring to FIGS. 4 and 5, the housing 210 includes a first connecting portion 212, and one end of the mainboard heat dissipation member 231 is coupled to the first connecting portion 212. In this way, it is convenient to connect the mainboard heat dissipation member 231 and the mainboard 221. It should be noted that the first connecting portion 212 may be any first connecting portion 212 that is relatively close to the mainboard heat dissipation member 231. In some embodiments, the mainboard heat dissipation member 231 and the first connecting portion 212 are in direct contact with each other and are not fixedly connected through other components. In some embodiments, the mainboard heat dissipation member 231 may be fixed to the first connecting portion 212 by fixing members (such as screws) or a thermally conductive adhesive layer. In some embodiments, continuing to refer to FIG. 5, the first connecting portion 212 may be a first convex portion 202 formed in such a way that a wall of the housing 210 protrudes toward the mounting cavity 211, and correspondingly, a mounting groove is formed on an outer side of the first convex portion 202, to assemble control buttons and other components. In some embodiments, the first connecting portion 212 may also be a first connecting wall that protrudes into the mounting cavity 211.

The mainboard heat dissipation member 231 can be designed in various structures. In some embodiments, the mainboard heat dissipation member 231 includes at least one heat dissipation portion, one end of the heat dissipation portion is assembled to the mainboard 221, and the other end of the heat dissipation portion is coupled to the first connecting portion 212. It can be understood that when the mainboard heat dissipation member 231 includes one or more heat dissipation portions, both ends of one heat dissipation portion may be coupled to the mainboard 221 and the first connecting portion 212 respectively. Alternatively, one of more than one heat dissipation portions is assembled to the mainboard 221, and the other heat dissipation portions are coupled to the first connecting portion 212.

Figure 6:
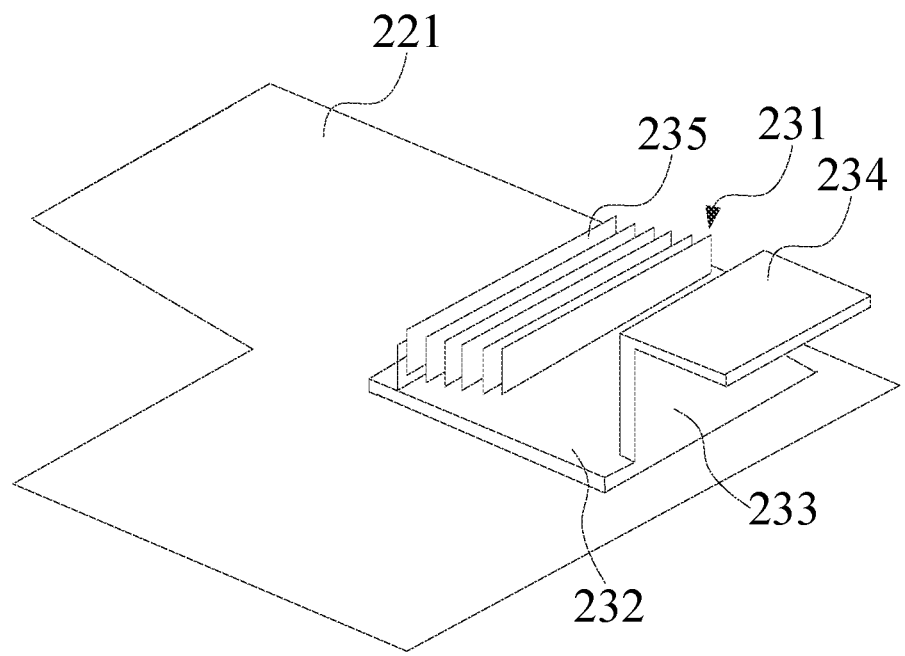
FIG. 6 is a structural diagram of a mainboard heat dissipation member and a mainboard after being assembled, according to an embodiment of the present disclosure.

FIG. 6 is a structural diagram of a mainboard heat dissipation member 231 and a mainboard 221 after being assembled, according to an embodiment of the present disclosure. In some embodiments, referring to FIGS. 4 and 6 in combination, the mainboard heat dissipation member 231 includes a first heat dissipation portion 232, a second heat dissipation portion 233, and a third heat dissipation portion 234 that are sequentially connected. The first heat dissipation portion 232 is assembled on the mainboard 221, the second heat dissipation portion 233 extends towards the first connecting portion 212, and the third heat dissipation portion 234 is coupled to the first connecting portion 212. In this way, the heat of the mainboard 221 transfers to the housing 210 through cooperation among the first heat dissipation portion 231, the second heat dissipation portion 233, and the third heat dissipation portion 234, which can also lengthen the length of the mainboard heat dissipation member 231 and facilitate absorption and transmission of more heat by the mainboard heat dissipation member. In addition, since the third heat dissipation portion 234 is coupled to the first connecting portion 212, it also helps to stabilize positions of the mainboard heat dissipation member 231 and the mainboard 221. Moreover, the mainboard heat dissipation member 231 can make full use of limited space within the housing 210, which can improve the integration level of components in the housing 210. In some embodiments, the first heat dissipation portion 232 and the third heat dissipation portion 234 are parallel, and an angle formed between the second heat dissipation portion 233 and the first heat dissipation portion 232 is 20°-90°. In this way, the mainboard heat dissipation member 231 forms a "Z-shaped" structure. In some embodiments, the third heat dissipation portion 234 is coupled to the first connecting portion 212, and the second heat dissipation portion 233 may be in contact with a side wall of the first connecting portion 212, such that a contact area between the mainboard heat dissipation member 231 and the housing 210 can be increased, and the mainboard heat dissipation member 231 can effectively transfer the heat of the mainboard 221 to the housing 210. In some embodiments, referring to FIG. 6, the first heat dissipation portion 232 is provided with more than one heat dissipation fins 235, such that the heat of the mainboard 221 can be effectively dissipated by more than one heat dissipation fins 235. In some embodiments, more than one heat dissipation fins 235 are arranged in parallel, and the heat dissipation fins 235 are perpendicular to a board surface of the mainboard 221, which can not only facilitate the arrangement, but also facilitate heat transfer through gaps among more than one heat dissipation fins 235.

In some embodiments, the material of at least one of the heat dissipation portion 235, the first heat dissipation portion 232, the second heat dissipation portion 233, and the third heat dissipation portion 234 is a metal material. In this way, the mainboard heat dissipation member 231 can absorb and transfer heat, and due to strong ductility of the metal material, the mainboard heat dissipation member 231 can be conveniently processed into different structures, thereby facilitating adaptation to a small-volume mounting cavity.

In some embodiments, continuing to refer to FIGS. 3, 4, and 5, the circuit board assembly 220 includes a logic board 222, the heat dissipation assembly 230 includes a logic board heat-dissipation member 236, the logic board heat-dissipation member 236 is assembled to the logic board 222, and one end of the logic board heat-dissipation member 236 is coupled to the housing 210. The logic (T-CON, Timing Controller) board 222 is used to: sequentially control signals sent by the mainboard 221 on the logic board 222 and convert them into drive signals to drive the display component 100 to work. The logic board 222 tends to generate heat during operation of the display component 100, and the heat of the logic board 222 is dissipated by the logic board heat-dissipation member 236, which can facilitate the efficient and stable operation of the logic board 222. In some embodiments, the logic board heat-dissipation member 236 may be fixed to the logic board 222 by a fixing member. In some embodiments, the logic board heat-dissipation member 236 may be bonded to the logic board 222 through a thermally conductive adhesive layer, which is not specifically limited in the present disclosure.

In some embodiments, continuing to refer to FIGS. 4 and 5, the housing 210 includes a second connecting portion 213, and one end of the logic board heat-dissipation member 236 is coupled to the second connecting portion 213. It should be noted that a distance between the logic board heat dissipation member 236 and the second connecting portion 213 is not limited in the present disclosure, and the second connecting portion 213 may be a second convex portion or second connecting wall 203 that is relatively close to the logic board heat dissipation member 236. The second convex portion protrudes from an inner wall of the housing 210 towards the mounting cavity 211, and the second connecting wall protrudes from the inner wall of the housing 210 towards the mounting cavity 211. In this way, the logic board heat-dissipation member 236 transfers the heat of the logic board 222 to the housing 210. In some embodiments, the logic board heat-dissipation member 236 is in contact with the second connecting portion 213. In some embodiments, the logic board 222 and the second connecting portion 213 are connected by a thermally conductive glue or a fixing member.

In some embodiments, the first connecting portion 212 and the second connecting portion 213 may be arranged on the housing 210 in a separated manner. In other words, the first connecting portion 212 and the second connecting portion 213 are separately arranged in different areas of the housing 210. In this way, the mainboard heat dissipation member 231 transfers heat to the first connecting portion 212, and the logic board heat-dissipation member 236 transfers heat to the second connecting portion 213, which can allow different areas of the housing 210 to receive heat respectively and facilitate efficient heat dissipation for the circuit board assembly. 220. In some embodiments, the first connecting portion 212 and the second connecting portion 213 may be arranged oppositely. For example, in FIG. 5, the first convex portion 202 and the second connecting wall 203 are arranged oppositely.

In some embodiments, the logic board heat-dissipation member 236 includes a graphite sheet for absorbing heat from the logic board 222 and conducting the heat. In some embodiments, the area of the logic board 222 is smaller than the area of the mainboard 221. Typically, graphite can be processed into a sheet structure, which is more suitable for the logic board 222 with a smaller area compared with the mainboard 221. In addition, the logic board heat-dissipation member 236 may also include metal heat dissipation fins.

In some embodiments, continuing to refer to FIG. 4, the housing 210 includes a first surface 214 and a second surface 215 opposite to the first surface 214. The display component 100 is located on one side of the first surface 214, the mainboard 221 and the logic board 222 are both arranged towards the first surface 214, and one of the mainboard 221 and the logic board 222 is close to the first surface 214 relative to the other one of the mainboard 221 and the logic board 222. In other words, for example as shown in FIG. 4, the mainboard 221 and the logic board 222 are arranged along an up-down direction. As a result, it is beneficial to reducing the space occupied by the circuit board assembly 220 and improving the integration level of the support assembly 200. In some embodiments, the logic board 222 may be arranged between the mainboard 221 and the first surface 214. In FIG. 4, the logic board 222 is arranged above the mainboard 221. In this way, when the mainboard heat dissipation member 231 includes the first heat dissipation portion 232, the second heat dissipation portion 233, and the third heat dissipation portion 234, the logic board 222 can be assembled in a space formed by the first heat dissipation portion 232 and the second heat dissipation portion 233, which is beneficial to improving the integration level of the support assembly 200. In addition, the mainboard 221 may also be arranged between the logic board 222 and the first surface 214.

In some embodiments, continuing to refer to FIG. 4, the circuit board assembly 220 further includes a power supply board 223 arranged towards the first surface 214, and one of the power supply board 223 and the mainboard 221 is close to the first surface 214 relative to the other one of the power supply board 223 and the mainboard 221. In this way, since the power supply board 223 supplies power to the display component 100 and the mainboard 221, the length of cables between the mainboard 221 and the logic board 222 and the display component 100 can be shortened, which is beneficial to improving the integration level of the support assembly 200. In some embodiments, the power supply board 223 is arranged between the mainboard 221 and the second surface 215, and the logic board 222 may be arranged between the mainboard 221 and the first surface 214. In the embodiment of the present disclosure, continuing to refer to FIG. 4, at least one of the mainboard 221, the logic board 222, and the power supply board 223 may be fixedly assembled in the mounting cavity 211 of the housing 210 through components such as a strut assembly 201, and the support assembly 201 may include more than one supports. The mainboard 221 and the logic board 222 can be fixedly connected and the mainboard 221 and the power supply board 223 can also be fixedly connected, by components such as the strut assemblies 201.

In some embodiments, a wall of the housing 210 is provided with more than one heat dissipation holes 217 in communication with the mounting cavity 211, so that air can circulate in the mounting cavity 211 of the housing 210 to take away heat. In some embodiments, more than one heat dissipation holes 217 are evenly arranged on the wall of the housing 210, and a part of the heat dissipation holes 217 are arranged opposite to another part of the heat dissipation holes 217. For example, both the first surface 214 and a side surface 216 of the housing 210 may be provided with the heat dissipation holes 217. In this way, the heat of the circuit board assembly 220 transfers to the housing 210 through the heat dissipation assembly 230, and convection is formed in the mounting cavity 211 of the housing 210 through the heat dissipation holes 217, to effectively improve the heat dissipation effect, which is conducive to high integration and effective heat dissipation for the circuit board assembly 220 in the narrow and small space of the housing 210.

In some embodiments, referring to FIGS. 2 and 4 in combination, a groove 218 is provided on the housing 210 of the support assembly 200, and the display screen is arranged in the groove 218 of the support assembly 200. In this way, the display component 100 is supported by the housing 210. In some embodiments, the groove 218 is provided with an interface, and the interface is coupled to the circuit board assembly 220 through a cable. After the display component 100 is assembled in the groove 218, the display component 100 is electrically coupled to the interface. In some embodiments, the housing 210 may include two half-housings arranged opposite to each other. The two half-housings cooperate to form the groove 218, and each half-housing may be provided with a second connecting portion 213 protruding into the mounting cavity 211. The two second connecting portions 213 of the two half-housings may be two parallel second connecting walls 203, and the two second connecting walls 203 cooperate to form the groove 218. One of the second connecting portions 213 can be coupled to the aforementioned logic board heat-dissipation member 236.

In some embodiments, the mounting cavity includes at least two areas, i.e., a first area and a second area; the mainboard, the logic board, and the power supply board are all arranged in the first area of the mounting cavity; an audio component is arranged in the second area.

In this way, there is no need to arrange any audio component in the display component, which is beneficial to achieving a display effect with a high screen-to-body ratio.

In some embodiments, at least two of the mainboard, the logic board, and the power supply board are arranged in a staggered manner or on a common plane.

In some embodiments, at least one of the mainboard, the logic board, and the power supply board is arranged parallel to a bottom wall of the groove.

In some embodiments, the display device includes a transparent television.

In addition, the display device may also be other devices including the display component 100. For example, a display screen of a notebook computer may be a transparent display screen.

In some embodiments, more than one supports are provided in the mounting cavity to support the mainboard, the logic board, and the power supply board.

For example, a first support, a second support and/or a third support are provided in the mounting cavity; the first support is coupled to the housing and used to support the mainboard; the second support is coupled to the housing and used to support the power supply board; the third support is used to provide support between the mainboard and the power supply board or between the mainboard and the logic board.

In summary, for the support assembly 200 and the display device according to the embodiments of the present disclosure, the mainboard heat dissipation member 231 is assembled to the mainboard 221, one end of the mainboard heat dissipation member 231 is coupled to the first connecting portion 212 of the housing 210, and the mainboard heat dissipation member 231 is made of the metal material, so that the heat of the mainboard 221 can be transferred to the housing 210 to dissipate heat of the mainboard 221. The logic board heat-dissipation member 236 is assembled to the logic board 222, one end of the logic board 222 is coupled to the second connecting portion 213 of the mounting cavity 211 of the housing 210, and the logic board 222 is a graphite sheet, such that the heat of the logic board 222 can be transferred to the housing 210. The mainboard heat dissipation member 231 and the logic board heat-dissipation member 236 cooperate, and the housing 210 is used cleverly to assist in heat dissipation, to effectively dissipate the heat of the circuit board assembly 220. Moreover, in combination with the heat dissipation holes 217 to form air convection, it is more conducive to heat dissipation of the circuit board assembly 220 in the narrow and small space of the housing 210, ensuring the efficient and stable operation of the circuit board assembly 220. In addition, the logic board 222, the mainboard 221, and the power supply board 223 can be arranged in a stacked manner, which is beneficial to improving the integration level. Since the circuit board assembly 220 and the heat dissipation assembly 230 are assembled in the mounting cavity 211 of the housing 210 of the support assembly 200, the separation of the circuit board assembly 220, the heat dissipation assembly 230, and the display component 100 can be achieved, which is beneficial to realizing the transparent display effect of the display screen 110.

The above-mentioned various embodiments of the present disclosure can complement each other without causing conflicts.

The above description only elaborates some embodiments of the present disclosure, and is not intended to limit the present disclosure. Any modification, equivalent replacement, improvement or the like made within the principle of the present disclosure shall be included in the protection scope of the present disclosure.

What is claimed is:

1. A support assembly configured to support a display component, and comprising:
   a housing comprising a mounting cavity;
   a circuit board assembly assembled in the mounting cavity; and
   a heat dissipation assembly assembled to the circuit board assembly;
   wherein the circuit board assembly comprises a mainboard, and wherein the heat dissipation assembly comprises a mainboard heat dissipation member, the mainboard heat dissipation member being assembled to the mainboard, and one end of the mainboard heat dissipation member being coupled to the housing;
   wherein the housing comprises a first connecting portion, one end of the mainboard heat dissipation member being coupled to the first connecting portion;
   wherein the mainboard heat dissipation member comprises a first heat dissipation portion, a second heat dissipation portion, and a third heat dissipation portion that are sequentially connected, the first heat dissipation portion being assembled to the mainboard, the second heat dissipation portion extending towards the first connecting portion, and the third heat dissipation portion being coupled to the first connecting portion;
   wherein the first connecting portion is a first convex portion formed in such a way that a wall of the housing protrudes toward the mounting cavity, and
   wherein a mounting groove is formed on an outer side of the first convex portion.

2. The support assembly according to claim 1, wherein the heat dissipation assembly is coupled to the housing, and heat of the circuit board assembly transfers to the housing through the heat-dissipation assembly.

3. The support assembly according to claim 1, wherein the circuit board assembly comprises a logic board, and the heat dissipation assembly comprises a logic board heat-dissipation member, the logic board heat-dissipation member being assembled to the logic board, and one end of the logic board heat-dissipation member being coupled to the housing.

4. The support assembly according to claim 3, wherein the housing comprises a second connecting portion, and wherein one end of the logic board heat-dissipation member is coupled to the second connecting portion.

5. The support assembly according to claim 3, wherein the logic board heat-dissipation member comprises a graphite sheet.

6. The support assembly according to claim 1, wherein a wall of the housing is provided with more than one heat dissipation holes in communication with the mounting cavity.

7. The support assembly according to claim 4, wherein the second connecting portion is a second convex portion second connecting wall that is close to the logic board heat dissipation member and protrudes from an inner wall of the housing towards the mounting cavity.

8. A display device, comprising: a display component comprising a display screen; and
   a support assembly configured to support the display component, wherein the support assembly comprises:
   a housing comprising a mounting cavity;
   a circuit board assembly assembled in the mounting cavity; and
   a heat dissipation assembly assembled to the circuit board assembly;
   wherein the circuit board assembly comprises a mainboard, and wherein the heat dissipation assembly comprises a mainboard heat dissipation member, the mainboard heat dissipation member being assembled to the mainboard, and one end of the mainboard heat dissipation member being coupled to the housing;
   wherein the housing comprises a first connecting portion, one end of the mainboard heat dissipation member being coupled to the first connecting portion;
   wherein the mainboard heat dissipation member comprises a first heat dissipation portion, a second heat dissipation portion, and a third heat dissipation portion that are sequentially connected, the first heat dissipation portion being assembled to the mainboard, the second heat dissipation portion extending towards the first connecting portion, and the third heat dissipation portion being coupled to the first connecting portion;
   wherein the first connecting portion is a first convex portion formed in such a way that a wall of the housing protrudes toward the mounting cavity, and
   wherein a mounting groove is formed on an outer side of the first convex portion.

9. The display device according to claim 8, wherein a groove is provided on the housing of the support assembly, and wherein the display screen is arranged in the groove of the support assembly.

10. The display device according to claim 9, wherein the circuit board assembly comprises a logic board, and a power supply board.

11. The display device according to claim 10, wherein the housing comprises a first surface and a second surface opposite to the first surface;
   and wherein the display component is located on one side of the first surface, the mainboard and the logic board are both arranged towards the first surface, and one of the mainboard and the logic board is close to the first surface relative to the other one of the mainboard and the logic board.

12. The display device according to claim 11, wherein the power supply board is arranged towards the first surface, and one of the power supply board and the mainboard is close to the first surface relative to the other one of the power supply board and the mainboard.

13. The display device according to claim 10, wherein the mounting cavity comprises a first area and a second area; the mainboard, the logic board, and the power supply board are all arranged in the first area of the mounting cavity; and an audio component is arranged in the second area.

14. The display device according to claim 10, wherein at least two of the mainboard, the logic board, and the power supply board are arranged in a staggered manner or on a common plane.

15. The display device according to claim 10, wherein at least one of the mainboard, the logic board, and the power supply board is arranged parallel to a bottom wall of the groove.

16. The display device according to claim 10, wherein more than one supports are provided in the mounting cavity to support the mainboard, the logic board, and the power supply board.

* * * * *